US011394182B2

(12) United States Patent
Ho et al.

(10) Patent No.: US 11,394,182 B2
(45) Date of Patent: Jul. 19, 2022

(54) POWER DEVICE AND METHOD FOR VISUALIZING INFORMATION THEREOF

(71) Applicant: CYBER POWER SYSTEMS, INC., Taipei (TW)

(72) Inventors: Lien-Hsun Ho, Taipei (TW); Shou-Ting Yeh, Taipei (TW); Yi-Ping Tsao, Taipei (TW); Tsai-Jung Chan, Taipei (TW); Cheng-Yen Lo, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 302 days.

(21) Appl. No.: 16/563,258

(22) Filed: Sep. 6, 2019

(65) Prior Publication Data
US 2021/0296864 A1 Sep. 23, 2021

(30) Foreign Application Priority Data

May 7, 2019 (CN) .......................... 201910376403.9

(51) Int. Cl.
*G06F 3/04817* (2022.01)
*G06F 3/04847* (2022.01)
*G06F 3/0488* (2022.01)
*H02B 15/00* (2006.01)
*H02J 9/00* (2006.01)

(52) U.S. Cl.
CPC ........... *H02B 15/00* (2013.01); *G06F 3/0488* (2013.01); *G06F 3/04817* (2013.01); *G06F 3/04847* (2013.01); *H02J 9/00* (2013.01)

(58) Field of Classification Search
None
See application file for complete search history.

(56) References Cited

U.S. PATENT DOCUMENTS

| 3,582,927 A * | 6/1971 | Primavera .............. H02B 15/00 340/815.49 |
| 11,073,925 B1 * | 7/2021 | McClain ................ G06F 3/0488 |
| 2008/0002072 A1 * | 1/2008 | Ong ................... G02F 1/133707 349/37 |
| 2013/0076718 A1 * | 3/2013 | Sirpal ..................... G06F 3/048 345/211 |

(Continued)

FOREIGN PATENT DOCUMENTS

| CN | 103235454 A | 8/2013 |
| TW | M324211 U | 12/2007 |
| TW | I589081 B | 6/2017 |

OTHER PUBLICATIONS

My Q/A Corner, "Why is LCD (Liquid Crystal Display) device so named?," Jan. 2017, http://myqacorner.blogspot.com/2017/01/liquid-crystal-display.html.*

(Continued)

*Primary Examiner* — Ryan Barrett
(74) *Attorney, Agent, or Firm* — Bacon & Thomas, PLLC (57) ABSTRACT

A power device and a method for visualizing information thereof are provided. The power device is configured to provide operation power to at least one load. The power device comprises a display interface and a control circuit. The control circuit is configured to display a color icon by the display interface, so as to show at least one of a system status and a system setting of the power device by the color icon.

20 Claims, 7 Drawing Sheets

(56) References Cited

U.S. PATENT DOCUMENTS

| | | | |
|---|---|---|---|
| 2014/0078716 A1* | 3/2014 | Ninan | H01L 27/322 977/774 |
| 2015/0048684 A1* | 2/2015 | Rooyakkers | H02J 9/00 429/61 |
| 2015/0051749 A1 | 2/2015 | Hancock et al. | |
| 2016/0308365 A1* | 10/2016 | Mayer | G01R 19/16566 |
| 2017/0102907 A1* | 4/2017 | Kuo | G06F 3/1423 |
| 2017/0156076 A1* | 6/2017 | Eom | H04W 8/005 |
| 2017/0200240 A1* | 7/2017 | Marinelli | H04L 41/0681 |
| 2018/0188328 A1* | 7/2018 | Hsieh | H02J 7/0013 |
| 2018/0364286 A1* | 12/2018 | Sharp | G01R 19/0092 |
| 2019/0081479 A1* | 3/2019 | Faley | H02J 3/32 |

OTHER PUBLICATIONS

Tien et al., "Light Leakage of Multidomain Vertical Alignment LCDs Using a Colorimetric Model in the Dark State," Jun. 3, 2018, Advances in Condensed Matter Physics, https://doi.org/10.1155/2018/6386428.*

Mitnik, "The Anatomy of LCD Displays," Dec. 11, 2017, http://display.phoenixdisplay.com/blog/the-anatomy-of-lcd-displays.*

* cited by examiner

POWER DEVICE AND METHOD FOR VISUALIZING INFORMATION THEREOF

BACKGROUND OF THE INVENTION

Field of the Invention

The present invention relates to the field of power technologies, and more particularly, to a power device and a method for visualizing information thereof.

Description of Related Art

Power devices, such as uninterruptible power systems (UPSs), AC-DC converters, DC-AC inverters, DC-DC converters, power distribution units (PDUs), automatic transfer switches (ATSs) are used to provide operation power to at least one load, so that the loads can operate in normal.

Since the power devices play important roles as described above, it has become an important topic that how to enable a user to quickly understand current system statuses of the power devices to troubleshoot or perform corresponding disposal when malfunction occurs on either of the power devices.

SUMMARY OF THE INVENTION

An object of the present invention is to provide a power device, which can provide visualized information, thereby enabling a user to quickly understand current system statuses of the power device.

Another object of the present invention is to provide a method for visualizing information of a power device.

To achieve the above object, the present invention provides a power device, which is configured to provide operation power to at least one load. The power device comprises a display interface and a control circuit. The control circuit is configured to display a color icon by the display interface, so as to show at least one of a system status and a system setting of the power device by the color icon.

To achieve the above another object, the present invention provides a method for visualizing information of a power device, wherein the power device is configured to provide operation power to at least one load. The method comprises the steps of providing a display interface; and displaying a color icon by the display interface, so as to show at least one of a system status and a system setting of the power device by the color icon.

In order to nuke the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 1:
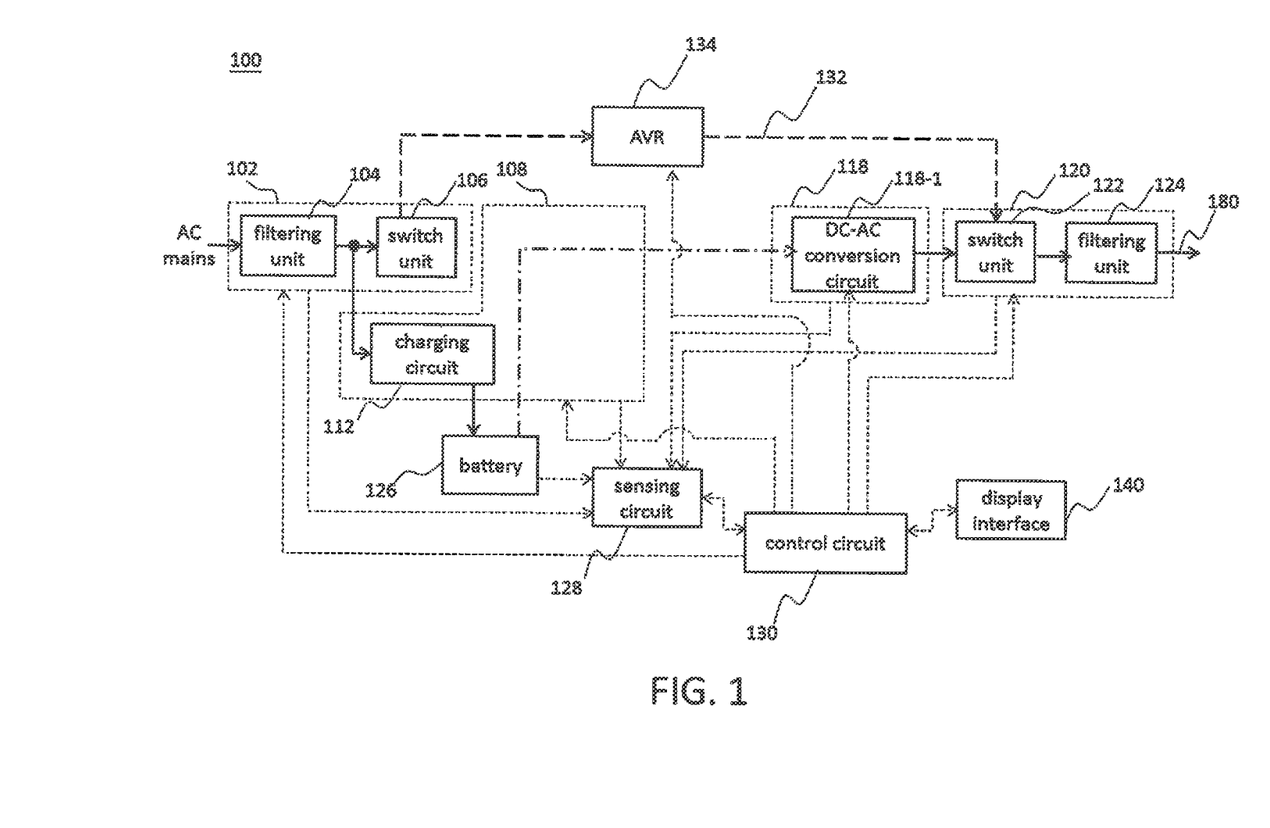
FIG. 1 shows a power device according to an embodiment of the present invention.

FIG. 1 shows a power device according to an embodiment of the present invention. Referring to FIG. 1, the input terminal of the power device 100 is electrically coupled to AC mains, and the output terminal 180 of the power device 100 is configured to provide operation power to at least one load (not shown). As shown in FIG. 1, the power device 100 is an uninterruptible power system and, in more detail, a line-interactive uninterruptible power system. The line-interactive uninterruptible power system comprises an input unit 102, a first voltage conversion unit 108, a second voltage conversion unit 118, an output unit 120, a battery 126, a sensing circuit 128, a control circuit 130, an automatic voltage regulator (AVR) 134, and a display interface 140. In this embodiment, the input unit 102 comprises a filtering unit 104 and a switch unit 106. The first voltage conversion unit 108 is implemented by a charging circuit 112. The second voltage conversion unit 118 comprises a DC-AC conversion circuit 118-1. The output unit 120 comprises a switch unit 122 and a filtering unit 124.

The control circuit 130 is electrically coupled to the input unit 102, the first voltage conversion unit 108, the second voltage conversion unit 118, the output unit 120, the sensing circuit 128, the automatic voltage regulator 134 and the display interface 140, so as to control their operation. For example, the control circuit 130 controls the operation of the switch unit 106 to determine whether to provide the output of the filtering unit 104 to the automatic voltage regulator 134. For another example, the control circuit 130 controls the operation of the switch unit 122, so as to electrically couple the input of the filtering unit 124 to the output of the DC-AC conversion circuit 118-1 or to the bypass path 132, thereby providing operation power required by the load through the output terminal 180.

In addition, the sensing circuit 128 is electrically coupled to the input unit 102, the first voltage conversion unit 108, the second voltage conversion unit 118, the output unit 120, the battery 126 and the control circuit 130, and is configured to sense the input unit 102, the first voltage conversion unit 108, the second voltage conversion unit 118, the output unit 120 and the battery 126 to provide a sensing data to the control circuit 130. Thus, the control circuit 130 can determine at least one of the system statuses of the line-interactive uninterruptible power system according to the sensing data (the so-called system statuses will be described in detail later). Furthermore, in this embodiment, the display interface 140 comprises a touch panel, and the control circuit 130 is further configured to receive, through the touch panel, at least one system setting inputted by a user (the so-called system setting will be described in detail later). Accordingly, the control circuit 130 can display a color icon by the display interface 140, so as to show at least one of the system statuses and the system settings of the line-interactive uninterruptible power system by the color icon.

Figure 2:
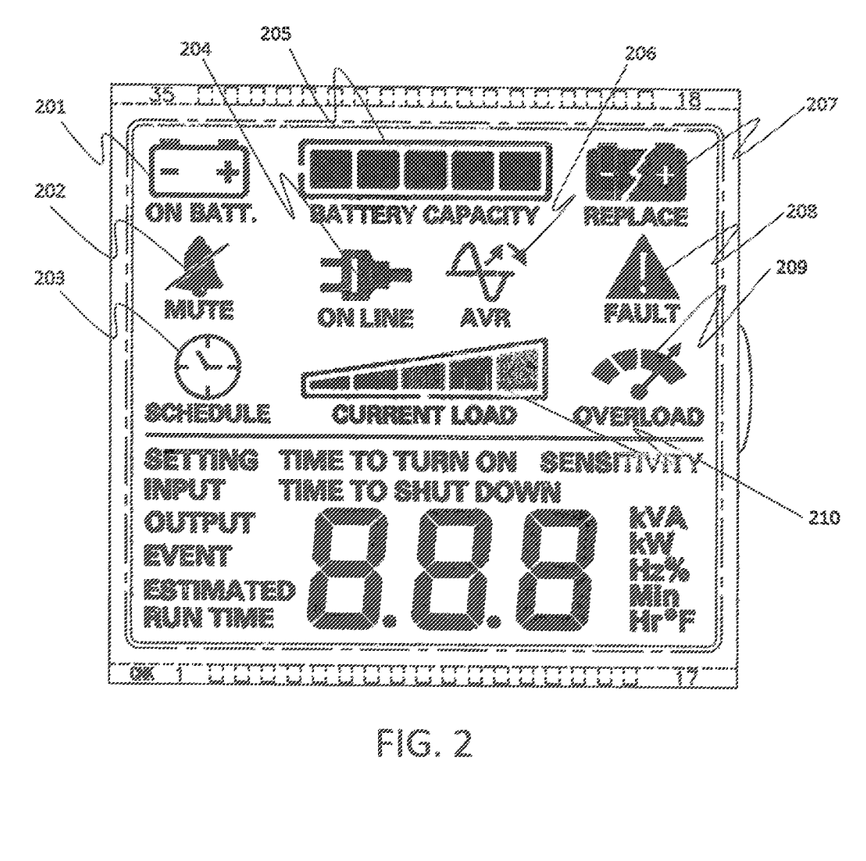
FIG. 2 shows the predetermined information which may be displayed on the display interface 140.

FIG. 2 shows the predetermined information which may be displayed on the display interface 140. As shown in FIG. 2, the predetermined information which may be displayed on the display interface 140 comprises operation information of the line-interactive uninterruptible power system (such as output/input power, output/input voltage frequency, remaining runtime) and icons 201-210. The icon 202 is configured to present one of the system settings of the line-interactive uninterruptible power system, and each of the remaining icons is configured to present one of the system statuses of the line-interactive uninterruptible power system. The system statuses and the system settings corresponding to the texts in these icons are shown in Table 1 below.

TABLE 1

| The texts in icon | Corresponding system status or system setting |
|---|---|
| ON BATT. | Battery mode |
| MUTE | Mute setting |
| SCHEDULE | Schedule executed |
| ON LINE | Line mode |
| BATTERY CAPACITY | Remaining power of battery |
| AVR | Automatic voltage regulator enabled |
| REPLACE | Battery failure |
| FAULT | System error |
| OVERLOAD | Overload |
| CURRNET LOAD | Loading |

In this embodiment, the control circuit 130 displays blue icons 205 and 210 by the display interface 140 to show the remaining power of the battery 126 and the loading of the line-interactive uninterruptible power system, respectively. In addition, the control circuit 130 displays a yellow icon 201 by the display interface 140 when the line-interactive uninterruptible power system is in battery mode, and the control circuit 130 displays a green icon 204 by the display interface 140 when the line-interactive uninterruptible power system is in line mode. Moreover, when the display interface 140 displays the green icon 204 and the automatic voltage regulator 134 is enabled to perform voltage regulation, the control circuit 130 also displays a green icon 206 by the display interface 140. In other words, at this time the display interface 140 simultaneously displays the green icons 204 and 206.

Referring to FIG. 2 again, in this embodiment, when the line-interactive uninterruptible power system is set to be muted, the control circuit 130 displays a yellow icon 202 by the display interface 140. When the line-interactive uninterruptible power system executes the schedule (e.g., the shutdown schedule set by the user), the control circuit 130 displays a yellow icon 203 by the display interface 140. When the battery 126 fails and needs to be replaced, the control circuit 130 displays a red icon 207 by the display interface 140. When the line-interactive uninterruptible power system fails because of an event therein, the control circuit 130 displays a red icon 208 by the display interface 140. When the line-interactive uninterruptible power system is overloaded, the control circuit 130 displays a red icon 209 by the display interface 140.

Figure 3:
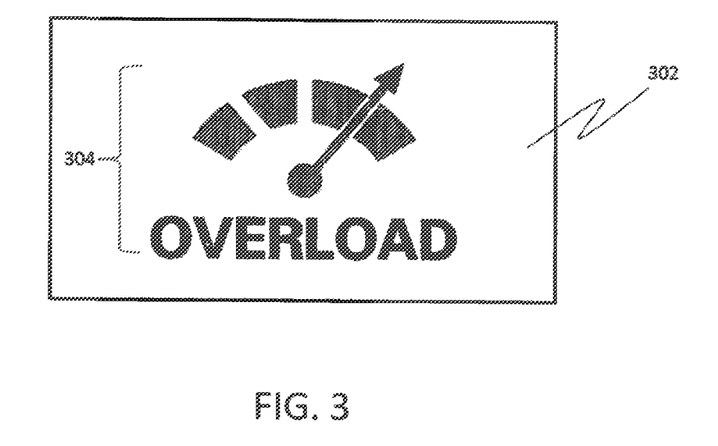
FIG. 3 shows another way to present icons.

Certainly the above icons are for illustrative purposes only and are not intended to limit the invention, Those of ordinary skill in the art may vary the shapes, colors, texts, number, and presented information of these icons according to different requirements. Taking the icon 209 as an example, it can also be presented in the manner shown in FIG. 3. FIG. 3 shows another way to present icons. As shown in FIG. 3, the icon has a color geometric graphics 302 and a hollow graphics 304 located therein. The color geometric graphics 302 is, for example, a blue rectangle, and the hollow graphics 304 can also exhibit a color (e.g., white, black, or red), thereby providing visual hollow effects. Certainly, the hollow graphics 304 can be varied according to different requirements, so as to present at least one of different system status and different system setting.

It is worth mentioning that, in another embodiment, the control circuit 130 further controls the display interface 140 to blink at least one of the displayed color icons, so as to present a system status and a system setting by the blinked color icon.

Referring to FIG. 1 again, in this embodiment, the display interface 140 is implemented by a liquid crystal display (LCD), an electrophoretic display (EPD), a plasma display or an organic light-emitting diode display (OLED display). In addition, the liquid crystal display can be implemented by either one of two types of graphical liquid crystal display. The first type of graphical liquid crystal display comprises a color patterned transparent film and a monochromatic liquid crystal display. The color patterned transparent film has a plurality of color icons, and the color icons can be, for example, icons 201-210 in FIG. 2, thereby presenting different system statuses and different system settings. The second type of graphical liquid crystal display comprises a glass substrate having a color patterned coating. The color patterned coating has a plurality of color icons, and the color icons can be, for example, the icons 201-210 in FIG. 2, thereby presenting different system statuses and different system settings.

Figure 4:
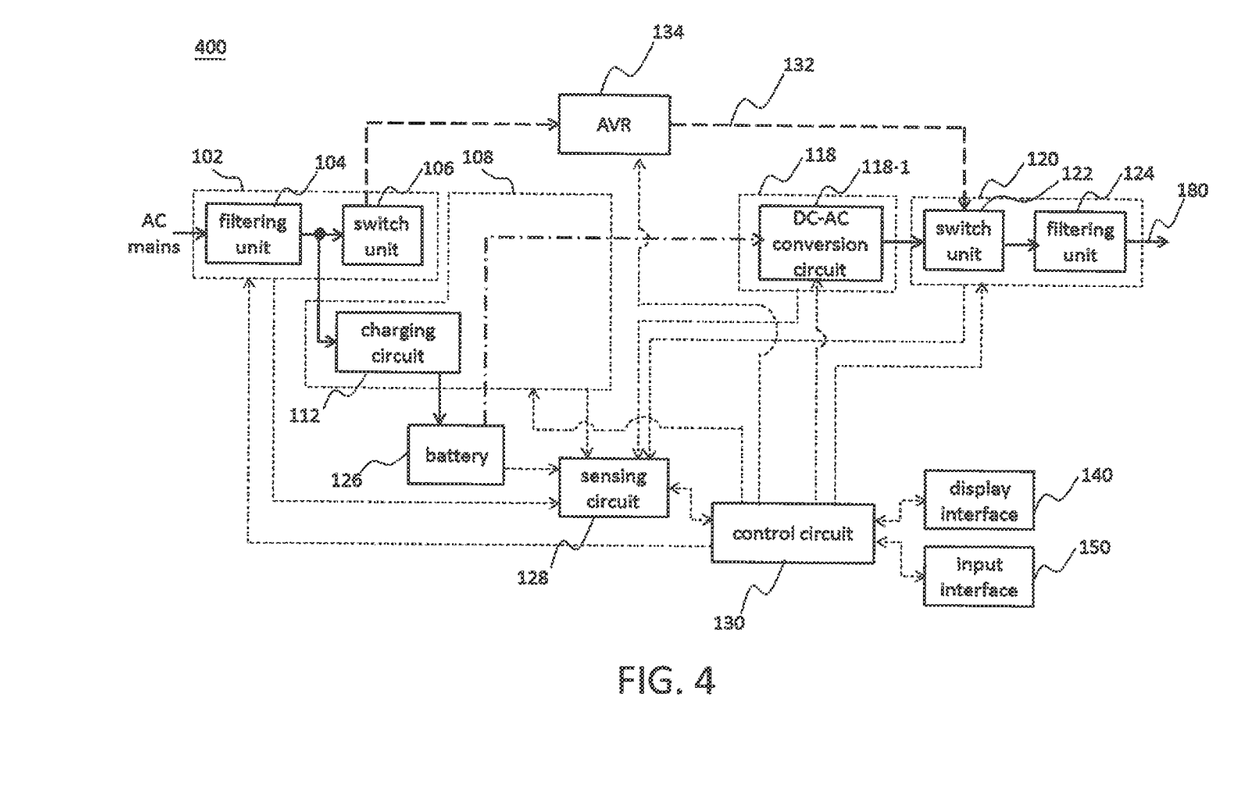
FIG. 4 shows a power device according to another embodiment of the present invention.

FIG. 4 shows a power device according to another embodiment of the present invention. In FIG. 4, the same reference numerals as those in FIG. 1 are denoted as the same members. As shown in FIG. 4, the power device 400 is an uninterruptible power system and, in more detail, a line-interactive uninterruptible power system. Compared with the power device 100 shown in FIG. 1, the power device 400 shown in FIG. 4 further adopts an input interface 150. The input interface 150 is implemented, for example, by at least one button. In this way, the control circuit 130 can receive, through the input interface 150, system settings inputted by a user.

Figure 5:
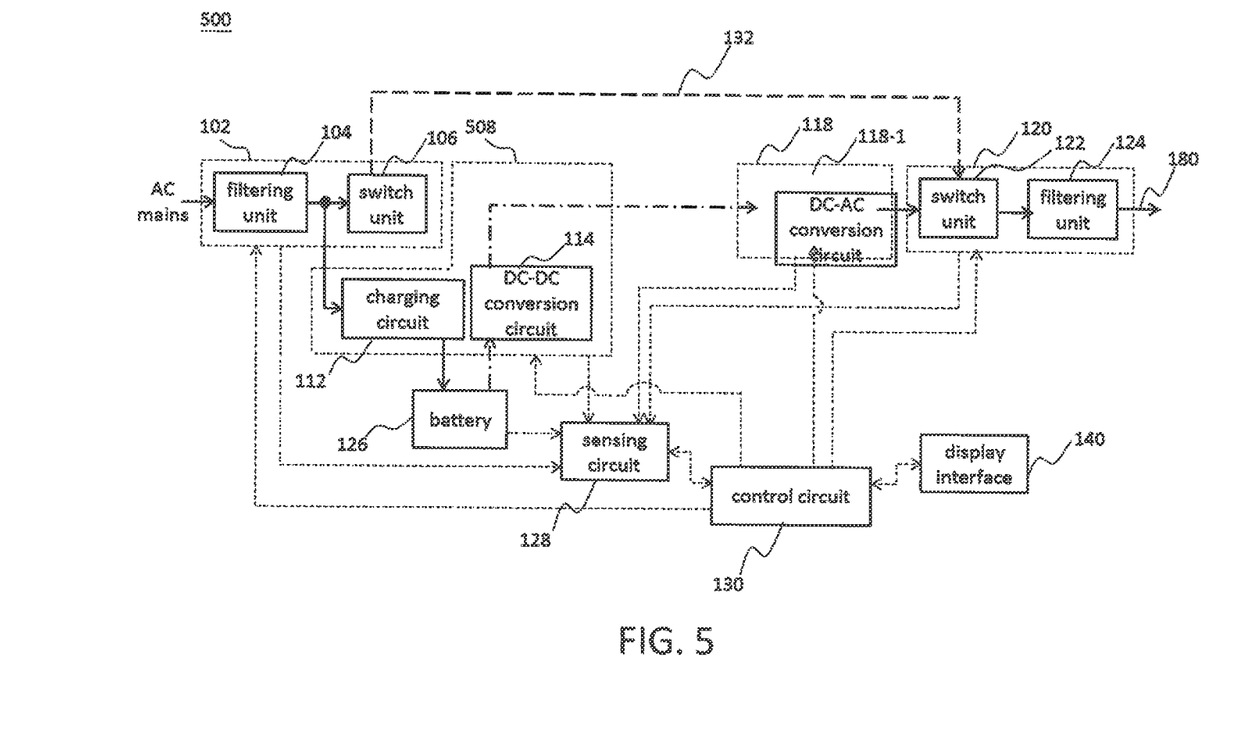
FIG. 5 shows a power device according to still another embodiment of the present invention.

FIG. 5 shows a power device according to still another embodiment of the present invention. In FIG. 5, the same reference numerals as those in FIG. 1 are denoted as the same members. As shown in FIG. 5, the power device 500 is an uninterruptible power system and, in more detail, an off-line uninterruptible power system. Compared with the power device 100 shown in FIG. 1, the first voltage conversion unit 508 of the power device 500 shown in FIG. 5 is composed of a charging circuit 112 and a DC-DC conversion circuit 114. Certainly, the operation information and the icons which may be displayed on the display interface 140 of the power device 500 can be varied according to the actual design of the power device 500 (e.g., without displaying the icon 206). in addition, the power device 500 can further adopt an input interface, so that the control circuit 130 can receive, through the input interface, system settings inputted by a user.

Figure 6:
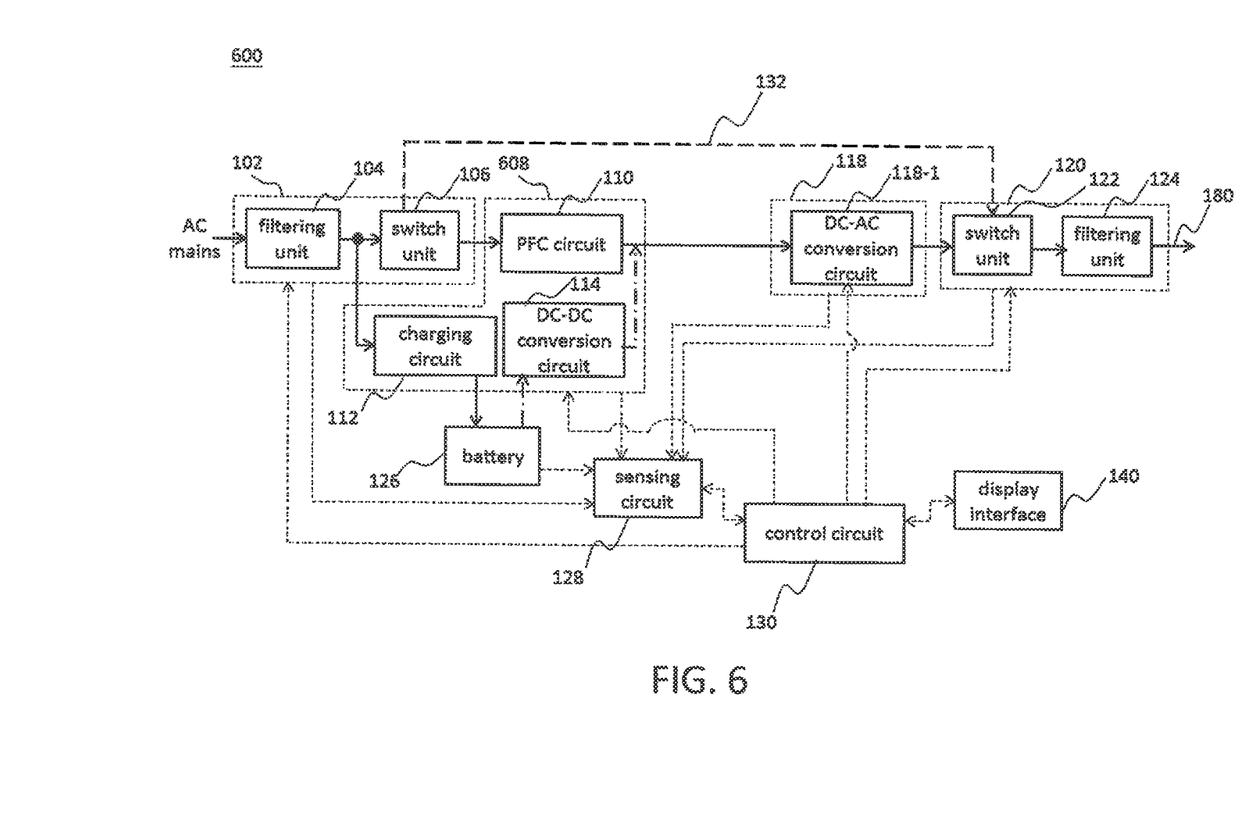
FIG. 6 shows a power device according to still another embodiment of the present invention.

FIG. 6 shows a power device according to still another embodiment of the present invention. In FIG. 6, the same reference numerals as those in FIG. 1 are denoted as the same members. As shown in FIG. 6, the power device 600 is an uninterruptible power system and, in more detail, an on-line uninterruptible power system. Compared with the power device 100 shown in FIG. 1, the first voltage conversion unit 608 of the power device 600 shown in FIG. 6 comprises a power factor correction circuit 110, a charging circuit 112, and a DC-DC conversion circuit 114. Certainly, the operation information and the icons which may be displayed on the display interface 140 of the power device 600 can be varied according to the actual design of the power device 600 (e.g., without displaying the icon 206). In addition, the power device 600 can further adopt an input interface, so that the control circuit 130 can receive, through the input interface, system settings inputted by a user.

Although in the above embodiments, each of the power devices is an uninterruptible power system, it is only used as an example and is not intended to limit the present invention. It should be understood by those skilled in the art that the power device of the present invention can also be an AC-DC converter, a DC-AC inverter, a DC-DC converter, a power distribution unit or an automatic transfer switch. Certainly, the operation information and the icons which may be displayed on the display interface of either one of the above power devices can be varied according to the actual design of the power device. For example, when a power device is an AC-DC converter, a DC-AC inverter, a DC-DC converter, a power distribution unit, or an automatic transfer switch, there is no need to display the icon 206 on its display interface. However, there may be a need to display icons 208 or 209.

Figure 7:
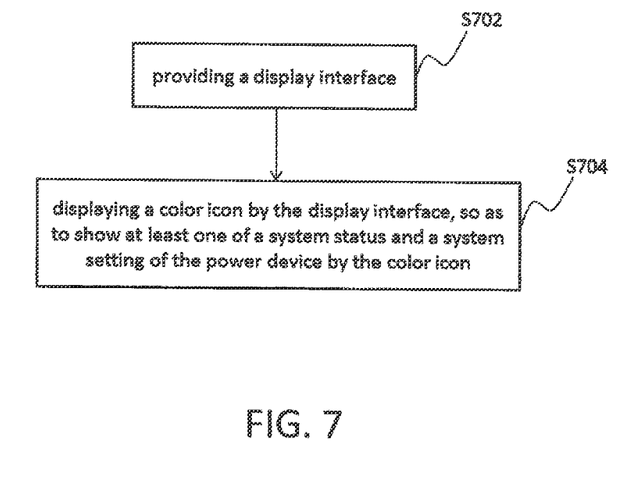
FIG. 7 is a flow chart of a method for visualizing information according to an embodiment of the present invention.

According to the above description, the present invention also provides a method for visualizing information of a power device. FIG. 7 is a flow chart of a method for visualizing information according to an embodiment of the present invention. The aforementioned power device is configured to provide operation power to at least one load. The method comprises the following steps: First, a display interface is provided (as shown in step S702). Then, a color icon is displayed by the display interface, so as to show at least one of a system status and a system setting of the power device by the color icon (as shown in step S704).

In summary, since the power device of the present invention can provide visualized information, a user can quickly understand its current system statuses. In this way, the user can quickly troubleshoot or perform corresponding disposal when malfunction occurs on the power device.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power device for providing operation power to at least one load, the power device comprising:
   a graphical liquid crystal display, comprising a monochromatic liquid crystal display and a color patterned transparent film having a plurality of color icons with different shapes; and
   a control circuit, configured to display at least one of the color icons by the graphical liquid crystal display, so as to show at least one of a system status and a system setting of the power device by the displayed at least one of the color icons.

2. The power device as claimed in claim 1, wherein the control circuit further controls the graphical liquid crystal display to blink the displayed at least one of the color icons, so as to show at least one of the system status and the system setting by the displayed at least one of the color icons.

3. The power device as claimed in claim 1, wherein the graphical liquid crystal display comprises a touch panel, and the control circuit is further configured to receive, through the touch panel, the system setting inputted by a user.

4. The power device as claimed in claim 1, further comprising an input interface, wherein the control circuit is further configured to receive, through the input interface, the system setting inputted by a user.

5. The power device as claimed in claim 4, wherein the input interface comprises at least one button.

6. The power device as claimed in claim 1, wherein the power device comprises an uninterruptible power system, an AC-DC converter, a DC-AC inverter, a DC-DC converter, a power distribution unit or an automatic transfer switch.

7. The power device as claimed in claim 6, wherein the uninterruptible power system comprises an input unit, a first voltage conversion unit, a second voltage conversion unit, an output unit, a battery and a sensing circuit, the sensing circuit is configured to sense the input unit, the first voltage conversion unit, the second voltage conversion unit, the output unit and the battery, thereby providing a sensing data to the control circuit so that the control circuit determines at least one system status of the uninterruptible power system according to the sensing data.

8. The power device as claimed in claim 7, wherein the uninterruptible power system is an on-line uninterruptible power system, and the input unit comprises a first switch unit, the output unit comprises a second switch unit, the second voltage conversion unit comprises a DC-AC conversion circuit, and the first voltage conversion unit comprises a power factor correction circuit, a charging circuit and a DC-DC conversion circuit.

9. The power device as claimed in claim 7, wherein the uninterruptible power system is an off-line uninterruptible power system, and the input unit comprises a first switch unit, the output unit comprises a second switch unit, the second voltage conversion unit comprises a DC-AC conversion circuit, and the first voltage conversion unit is composed of a charging circuit and a DC-DC conversion circuit.

10. The power device as claimed in claim 7, wherein the uninterruptible power system is a line-interactive uninterruptible power system, and the line-interactive uninterruptible power system further comprises an automatic voltage regulator, and the input unit comprises a first switch unit, the output unit comprises a second switch unit, the second voltage conversion unit comprises a DC-AC conversion circuit, and the first voltage conversion unit is a charging circuit.

11. A power device for providing operation power to at least one load, the power device comprising:
 a graphical liquid crystal display, comprising a glass substrate with a color patterned coating, the color patterned coating having a plurality of color icons with different shapes; and
 a control circuit, configured to display at least one of the color icons by the graphical liquid crystal display, so as to show at least one of a system status and a system setting of the power device by the displayed at least one of the color icons.

12. The power device as claimed in claim 11, wherein the control circuit further controls the graphical liquid crystal display to blink the displayed at least one of the color icons, so as to show at least one of the system status and the system setting by the displayed at least one of the color icons.

13. The power device as claimed in claim 1, wherein the graphical liquid crystal display comprises a touch panel, and the control circuit is further configured to receive, through the touch panel, the system setting inputted by a user.

14. The power device as claimed in claim 11, further comprising an input interface, wherein the control circuit is further configured to receive, through the input interface, the system setting inputted by a user.

15. The power device as claimed in claim 14, wherein the input interface comprises at least one button.

16. The power device as claimed in claim 11, wherein the power device comprises an uninterruptible power system, an AC-DC converter, a DC-AC inverter, a DC-DC converter, a power distribution unit or an automatic transfer switch.

17. The power device as claimed in claim 16, wherein the uninterruptible power system comprises an input unit, a first voltage conversion unit, a second voltage conversion unit, an output unit, a battery and a sensing circuit, the sensing circuit is configured to sense the input unit, the first voltage conversion unit, the second voltage conversion unit, the output unit and the battery, thereby providing a sensing data to the control circuit so that the control circuit determines at least one system status of the uninterruptible power system according to the sensing data.

18. The power device as claimed in claim 17, wherein the uninterruptible power system is an on-line uninterruptible power system, and the input unit comprises a first switch unit, the output unit comprises a second switch unit, the second voltage conversion unit comprises a DC-AC conversion circuit, and the first voltage conversion unit comprises a power factor correction circuit, a charging circuit and a DC-DC conversion circuit.

19. The power device as claimed in claim 17, wherein the uninterruptible power system is an off-line uninterruptible power system, and the input unit comprises a first switch unit, the output unit comprises a second switch unit, the second voltage conversion unit comprises a DC-AC conversion circuit, and the first voltage conversion unit is composed of a charging circuit and a DC-DC conversion circuit.

20. The power device as claimed in claim 17, wherein the uninterruptible power system is a line-interactive uninterruptible power system, and the line-interactive uninterruptible power system further comprises an automatic voltage regulator, and the input unit comprises a first switch unit, the output unit comprises a second switch unit, the second voltage conversion unit comprises a DC-AC conversion circuit, and the first voltage conversion unit is a charging circuit.

* * * * *